United States Patent [19]

Kniepkamp

[11] 3,831,068

[45] Aug. 20, 1974

[54] METAL-SEMICONDUCTOR SMALL-SURFACE CONTACTS

[75] Inventor: Hermann Kniepkamp, Munich, Germany

[73] Assignee: Siemens Aktiengesellschaft, Berlin & Munich, Germany

[22] Filed: Sept. 5, 1972

[21] Appl. No.: 286,265

[30] Foreign Application Priority Data

Sept. 29, 1971 Germany............................ 2148658

[52] U.S. Cl...... 317/234 R, 317/234 M, 317/234 N, 317/235 UA

[51] Int. Cl.............................................. H01l 5/00

[58] Field of Search.............. 317/234, 235.2, 235.3, 317/31

[56] References Cited

UNITED STATES PATENTS

| | | | |
|---|---|---|---|
| 3,368,124 | 2/1968 | Ditrick | 317/235 |
| 3,451,912 | 6/1969 | D'Heurle et al. | 204/192 |
| 3,518,506 | 6/1970 | Gates | 317/234 |
| 3,686,698 | 8/1972 | Akeyama et al. | 317/234 |
| 3,695,955 | 10/1972 | Jochems et al. | 156/11 |

*Primary Examiner*—Stanley D. Miller, Jr.
*Assistant Examiner*—E. Wojciechowicz
*Attorney, Agent, or Firm*—Hill, Gross, Simpson, Van Santen, Steadman, Chiara & Simpson

[57] ABSTRACT

Metal-semiconductor low capacitance contacts are produced by depositing a first metal layer on a semiconductor surface in the pattern corresponding to a desired contact pattern, applying a second metal layer on the first metal layer and coating all exposed metal and semiconductor surfaces with an insulator layer. Then areas of the insulator above the second metal layer are removed to expose only the underlying second metal surface and a third metal is deposited on such exposed second metal surface in an amount sufficient to extend beyond the upper surface or plane of the insulator coating and form a sufficiently large surface for contacting a given electrical component.

4 Claims, 4 Drawing Figures

METAL-SEMICONDUCTOR SMALL-SURFACE CONTACTS

BACKGROUND OF THE INVENTION

1. Field of the Invention

The invention relates to metal-semiconductor contacts and more particularly to metal-semiconductor small-surface contacts characterized by a low capacitance and a method of forming the same.

2. Prior Art.

Metal-semiconductor contacts comprised of a semiconductor having an insulator layer thereon with recesses therein at locations corresponding to a desired contact pattern, which are filled with a metal are known. These types of contacts are formed by coating the entire surface of a semiconductor with an insulator. Select areas of the insulator coating are then removed in a pattern corresponding with desired contact areas on the semiconductor. Then, contacts of a given electrical structure are produced on the insulator coating and on the exposed surface areas of the semiconductor by conventional metal deposition techniques. Electrical structures or components that contact a semiconductor are, for example, of circular shape, and generally have a substantially larger area than the metal-semiconductor contact. Such structures are joined to the metal-semiconductor contacts by conventional techniques.

A disadvantage of such metal-semiconductor contacts is that a capacitance occurs between the surface of the semiconductor and the component portion on the insulator layer. The capacitance is parallel to the contact itself and thus interferes with the blocking state of the contact. Certain components do not tolerate such parallel capacitance and consequently metal-semiconductor contacts of this type are only provisionally useful.

SUMMARY OF THE INVENTION

This invention provides metal-semiconductor small-surface contacts having a low capacitance characteristic which avoid the prior art disadvantages.

In its structural embodiments, the invention comprises a semiconductor member having at least one surface, a first metal layer on such semiconductor surface at locations thereon corresponding to desired contact positions, a second metal layer, referred to as a germination layer, on at least central portions of the first metal layer, an insulator coating on all exposed surfaces of the semiconductor surface, all exposed surfaces of the first metal layer and on at least peripheral portions of the second metal layer and a third metal layer, referred to as a growth layer, on the exposed second metal surfaces, which extends beyond the plane of the insulator coating and forms a sufficiently larger surface area above such plane for contacting a given electrical structure or component.

In its method embodiments, the invention comprises applying a first metal layer on a semiconductor surface at locations thereon corresponding to the desired contact positions, applying a second metal layer or germination layer on at least central portions of the first metal layer, coating all exposed portions of said semiconductor and metal surfaces with an insulator material, exposing at least central portions of the second metal surface and depositing a third metal layer or a growth layer on the exposed second metal surfaces in an amount sufficient to extend beyond the plane of the insulator coating and form a sufficiently large surface above such plane for contacting a given electrical component.

A preferred semiconductor material is gallium arsenide. A preferred first metal is chromium and a preferred second metal is gold, both of which are applied, for example, by vapor deposition techniques. The preferred insulator material is silicon dioxide. A preferred third metal is identical with the second metal and is preferably deposited by an electrolytic technique.

DESCRIPTION OF PREFERRED EMBODIMENTS

Figure 1:
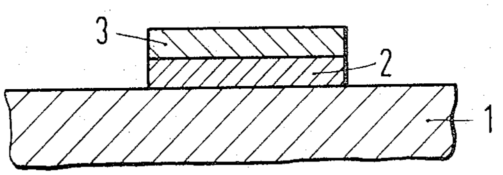
FIG. 1 is a partial diagrammatic sectional view of a partially produced metal-semiconductor contact in accordance with the principles of the invention.

The invention provides metal-semiconductor small-surface contacts which have a low capacitance characteristic.

The invention includes both structural and method embodiments. The structural embodiments comprise a semiconductor material having a surface for contacting a given electrical structure, a first metal layer on portions of such surface located at desired contact positions, a second metal layer on at least central surface portions of the first metal layer, an insulator coating on all exposed semiconductor surfaces, all exposed first metal surfaces and on at least some peripheral surface portions of the second metal layer and a third metal layer on all exposed second metal surfaces in an amount sufficient to extend above the plane of the insulator layer and form a sufficiently large surface for contacting the given electrical structure.

In certain structural embodiments, the second metal layer is of the same dimension as the first metal layer. In certain structural embodiments the semiconductor material is gallium arsenide. In certain other structural embodiments, the semiconductor material is an epitaxially layer on a highly doped substrate. In certain structural embodiments, the first metal is chromium, particularly when the semiconductor material is gallium arsenide. In certain other structural embodiments, the first metal is a gold-germanium alloy or a silver-indium-germanium alloy, particularly when the semiconductor member is gallium arsenide. In certain structural embodiments, the second metal or germination layer is composed of a metal selected from the group consisting of gold, silver and nickel. In certain structural embodiments, the insulator material is selected from the group consisting of $SiO_2$, $Al_2O_3$ and $Si_3N_4$. In certain other structural embodiments, the insulator material is a heat-cured photo lacquer or photo resist.

The method embodiments of the invention comprise applying a first metal layer on a semiconductor surface at locations thereon corresponding to desired contact positions, applying a second metal layer on at least central portions of the first metal layer surface, coating all exposed surface portions of the semiconductor and metal surfaces with an insulator layer, exposing at least central portions of the second metal layer surface and depositing a third metal layer on the exposed portions of the second metal surface in an amount sufficient to extend above the plane of the insulator layer and form a sufficiently large surface above such plane for contacting a given electrical component.

In certain method embodiments, the second metal layer is applied on the entire surface (top) of the first metal layer and has an essentially identical surface dimension as the first metal layer. In certain method embodiments, the insulator coated second metal layer is exposed along its entire top surface.

An important feature of the invention is that the metal-semiconductor contacts formed in accordance with the principles of the invention can be safely joined with all electrical components, even when a thick insulator layer is utilized. With the contact members of the invention, the parallel capacitance between the surface of the semiconductor and the portion of the third metal layer on the insulator layer is very low.

The invention was developed from the following theory. A limit in lowering parallel capacitance is the thickness of the insulator layer. This limit is attained because after a certain insulator layer thickness, vapor deposited metal does not form a continuous layer between the surface of the insulator layer and the surface of the semiconductor. Further, the production of a very small surfaces and exact dimension openings in an insulator layer is difficult with thick insulator layers.

In the drawings, like reference numerals refer to similar portions. As suggested earlier, semiconductors utilized in the practice of the invention can be massive semiconductor members or an epitaxial layer on a highly doped substrate. A preferred semiconductor is a semiconductor member composed of gallium arsenide.

As shown at FIG. 1, a semiconductor member 1 is coated at select locations thereof with a first metal layer 2. The select location corresponds to a desired contact position and a single or a plurality of such contact positions may be provided on a semiconductor member. By proper selection of a metal for forming layer 2, and by using a compatible application technique, such as vapor deposition, collector (blocking-free) contacts and/or Schottky-metal-semiconductor contacts are readily produced. The material for forming layer 2 is selected from the group consisting of chromium, a gold-germanium alloy and a silver-indium-germanium alloy. In a preferred embodiment that includes a gallium-arsenide semiconductor member, the metal forming layer 2 is chromium. In another preferred embodiment that includes a gallium-arsenide semiconductor member, the metal forming layer is selected from the group of a gold-germanium alloy or a silver-indium-germanium alloy. When Schottky-metal-semiconductor contacts are desired, chromium is preferably applied onto a gallium arsenide member and when gate or collector contacts are desired, a gold-germanium alloy or a silver-indium-germanium alloy is applied onto a gallium arsenide member.

A second metal layer 3, sometimes referred to herein as a germination or nucleation layer, is then applied, preferably by vapor deposition on at least the central portions of the first metal layer 2. Layer 3 is referred to as a germination or nucleation layer since a further metal layer grows or nucleates thereon. In preferred embodiments, the germination layer 3 is of the same dimension as the first metal layer 2, at least at the surface dimension thereof. In preferred embodiments, a second metal layer 3 is composed of a metal selected from the group consisting of gold, silver and nickel.

Figure 2:
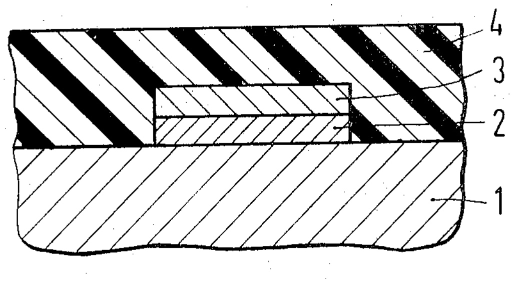
FIG. 2 is a view similar to that of FIG. 1 during a subsequent production step in accordance with the principles of the invention.

In FIG. 2, an insulator coating 4 is shown as applied on all exposed surface portions of the semiconductor member 1 and metal layers 2 and 3. The insulator coating is preferably composed of an electrical insulating material selected from the group consisting of $SiO_2$, $Al_2O_3$ and $Si_3N_4$. Another preferred insulating material is a heat-cured (baked) photo lacquer (i.e., a photo resist), since it has a lower dielectric constant than the other insulating materials mentioned.

Figure 3:
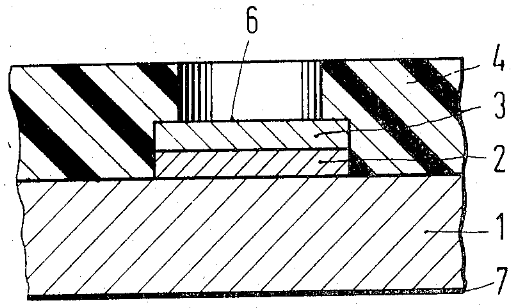
FIG. 3 is a view similar to that of FIG. 2 during a further production step in accordance with the principles of the invention.

Next, as shown in FIG. 3, areas of the insulator coating 4 above the second metal 3 are removed, as by a suitable etch. The exposed surface portion 6 of layer 3 corresponds to either the entire upper surface area of layer 3 or, as shown, to at least the central portion thereof, leaving the peripheral areas of layer 3 coated with the insulator coating 4.

Figure 4:
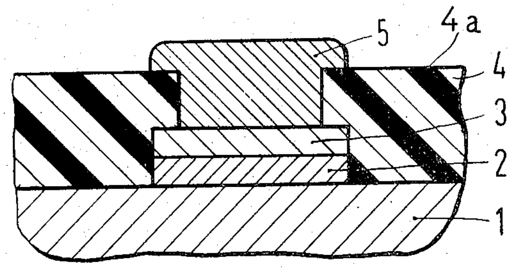
FIG. 4 is a view similar to that of FIG. 3 during a yet further production step in accordance with the principles of the invention.

A third metal layer 5, sometimes referred to as a growth layer, is then deposited on the exposed portions 6 of layer 3. As shown at FIG. 4, layer 5 is deposited in an amount sufficient to extend above the upper surface 4a of insulator layer 4. Thus, layer 5 extends above the plane of layer 4 and forms a sufficiently large surface above layer 4 for contacting a given electrical component.

The deposition or growth of layer 5 onto the exposed surface portion 6 of the germination layer 3 is preferably accomplished by an electrolytic process. An assembly, such as shown at FIG. 3, which includes a metal-semiconductor contact on one surface of a semiconductor member and a contact 7 on the oppositing surface thereof is submerged into an electrolyte bath. The bath contains the metal forming the germination layer 3 in ion form and by providing a suitable polarity to the semiconductor member 1, the growth layer 5 is deposited on the exposed surface portion 6 of germination layer 3 when the current flows between the semiconductor and an electrode, which is preferably a platinum electrode. This growth process is readily controlled and is terminated when the growth layer 5 extends beyond or above the plane of the insulator coating and forms a sufficiently large surface above such plane for contacting a given electrical component.

As is apparent from the foregoing specification, the present invention is susceptible of being embodied with the various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as is set forth and defined in the hereto-appended claims.

I claim as my invention:

1. A metal-semiconductor small-surface contact member consisting of:

a semiconductor member composed of gallium arsenide and having a surface for contacting a given electrical component;

a first metal layer on an area of said semiconductor surface corresponding to a desired location for contacting said electrical component, said first metal layer being composed of chromium and having side and top surfaces above said semiconductor surface so as to define first semiconductor surface areas which are covered by said first metal layer and second semiconductor surface areas which are free of said first metal layer, said first metal layer side surfaces extending laterally a select distance along said first semiconductor surface areas;

a second metal layer on at least central portions of said top surface of the first metal layer, said second metal layer having side and top surfaces above said top surface of the first metal layer, said second metal layer side surfaces extending laterally said select distance along said top surface of the first metal layer;

an insulator layer on said second semiconductor surface areas and on said side surfaces of said first metal layer and on at least said side surfaces of the second metal layer, said insulator layer having a top surface lying in a plane above said top surface of the second metal layer; and a third metal layer on at least central portions of said top surface of the second metal layer, said third metal layer having side and top surfaces extending above said top surface of the insulator layer, said third metal layer side surfaces extending laterally said select distance along said top surface of the insulator layer, said third metal layer top surface having a sufficiently large surface area in the plane above said top surface of the insulator layer for contacting said electrical component.

2. A metal-semiconductor small-surface contact member as defined in claim 1, wherein said semiconductor member comprises an epitaxial layer on a highly doped substrate.

3. A metal-semiconductor small-surface contact member as defined in claim 1, wherein said second metal layer is composed of a material selected from the group consisting of gold, silver and nickel.

4. A metal-semiconductor small-surface contact member as defined in claim 1, wherein said insulator coating is composed of an electrically insulating material selected from the group consisting of $SiO_2$, $Al_2O_3$ and $Si_3N_4$.

* * * * *